(12) United States Patent
Van Steenkiste et al.

(10) Patent No.: US 7,125,586 B2
(45) Date of Patent: Oct. 24, 2006

(54) KINETIC SPRAY APPLICATION OF COATINGS ONTO COVERED MATERIALS

(75) Inventors: Thomas Hubert Van Steenkiste, Ray, MI (US); Daniel William Gorkiewicz, Washington, MI (US); John R. Smith, Birmingham, MI (US); Martin Stier, Werne (DE); George Albert Drew, Warren, OH (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/812,861

(22) Filed: Mar. 30, 2004

(65) Prior Publication Data

US 2005/0025897 A1 Feb. 3, 2005

Related U.S. Application Data

(60) Provisional application No. 60/462,022, filed on Apr. 11, 2003.

(51) Int. Cl.
*B05D 1/02* (2006.01)
(52) U.S. Cl. .................. 427/448; 427/455; 427/456; 427/97.3; 427/98.4; 427/98.5; 427/123; 427/180; 427/205; 427/422
(58) Field of Classification Search ............... 427/446, 427/448, 455, 456, 180, 191, 192, 422, 427, 427/96.1, 97.3, 98.4, 98.5, 123
See application file for complete search history.

(56) References Cited

U.S. PATENT DOCUMENTS

| | | | | |
|---|---|---|---|---|
| 2,599,710 | A * | 6/1952 | Hathaway | 29/846 |
| 3,731,354 | A * | 5/1973 | Rayburn | 29/25.42 |
| 4,263,341 | A * | 4/1981 | Martyniak | 427/448 |
| 6,283,386 | B1 * | 9/2001 | Van Steenkiste et al. | 239/427 |
| 6,402,050 | B1 * | 6/2002 | Kashirin et al. | 239/79 |
| 6,592,947 | B1 * | 7/2003 | McCane et al. | 427/427 |
| 6,623,796 | B1 * | 9/2003 | Van Steenkiste | 427/189 |
| 2003/0219576 | A1 * | 11/2003 | Elmoursi et al. | 428/210 |
| 2004/0101738 | A1 * | 5/2004 | Tawfik et al. | 429/38 |
| 2004/0157000 | A1 * | 8/2004 | Steenkiste et al. | 427/446 |
| 2005/0040260 | A1 * | 2/2005 | Zhao et al. | 239/548 |

* cited by examiner

*Primary Examiner*—Katherine Bareford
(74) *Attorney, Agent, or Firm*—Scott A. McBain

(57) ABSTRACT

Disclosed is a process for applying a kinetic spray coating of powder particles onto a substrate covered in a plastic-type material without first removing the plastic-type material. In one use of the process a mask is used to enable a single kinetic spray pass to both remove the plastic covering and bind particles having average nominal diameters of from 60 to 250 microns to the underlying substrate. In another use of the process the particles have an average nominal diameter of from 250 to 1400 microns and the use of a mask is optional because the particles can penetrate the plastic material and bind directly to the substrate. The process finds special use in forming electrical connections or solderable pads anywhere along the length of a flexible circuit.

13 Claims, 4 Drawing Sheets

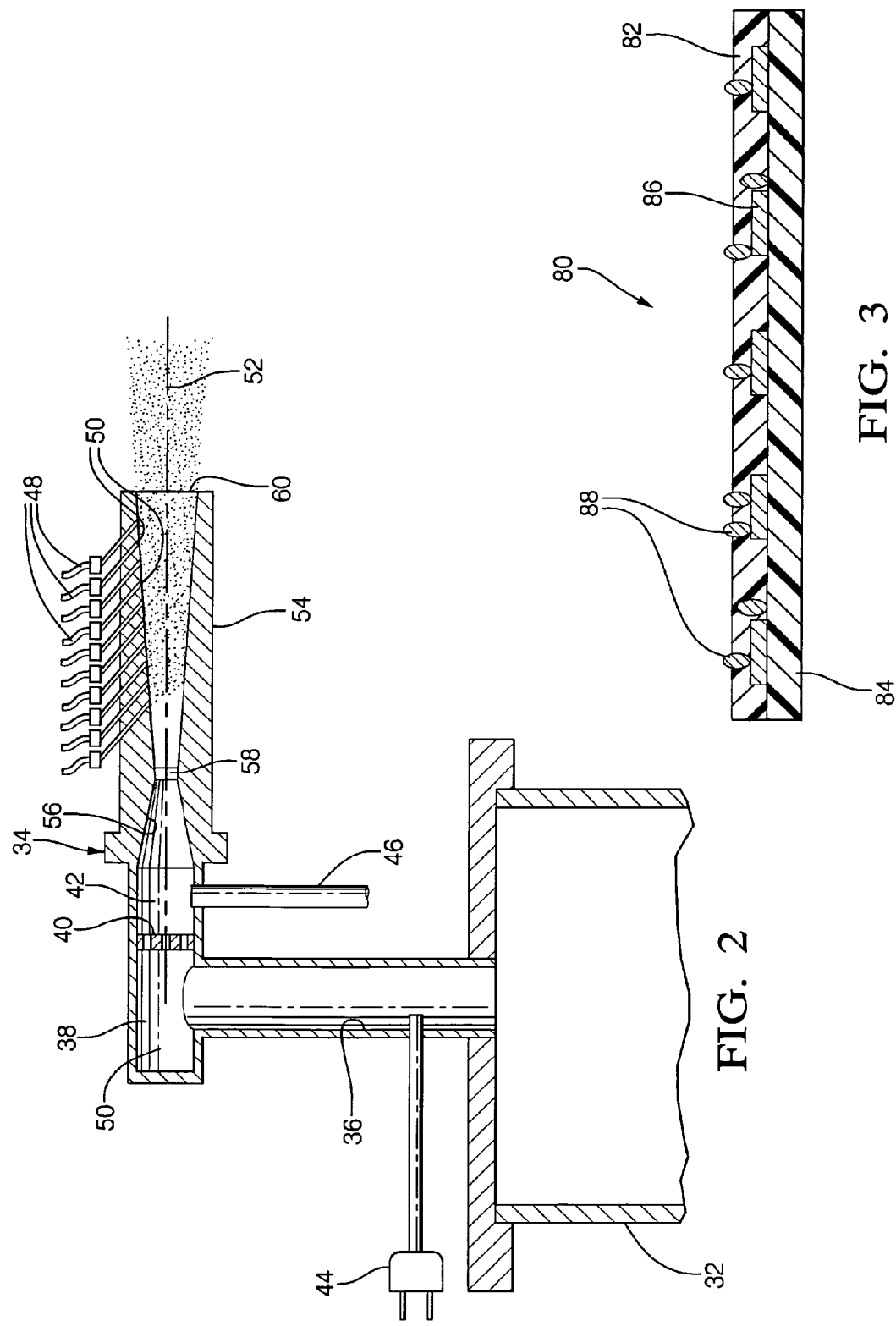

KINETIC SPRAY APPLICATION OF COATINGS ONTO COVERED MATERIALS

RELATED APPLICATIONS

This application claims the benefit of U.S. Provisional Application No. 60/462,022, filed Apr. 11, 2003.

TECHNICAL FIELD

The present invention is generally directed toward a method for applying a kinetic spray coating to a substrate that is covered in a plastic-type material without prior removal of the plastic-type cover material. More specifically, the present invention finds use in the kinetic spray application of coating material through a plastic over-layer onto underlying electrical contacts in flexible electrical circuitry.

INCORPORATION BY REFERENCE

The present invention comprises an improved use for the kinetic spray process as generally described in U.S. Pat. Nos. 6,139,913, 6,283,386 and the articles by Van Steenkiste, et al. entitled "Kinetic Spray Coatings" published in Surface and Coatings Technology Volume III, Pages 62–72, Jan. 10, 1999, and "Aluminum coatings via kinetic spray with relatively large powder particles", published in Surface and Coatings Technology 154, pp. 237–252, 2002, all of which are herein incorporated by reference.

BACKGROUND OF THE INVENTION

A new technique for producing coatings on a wide variety of substrate surfaces by kinetic spray, or cold gas dynamic spray, was recently reported in two articles by T. H. Van Steenkiste et al. The first was entitled "Kinetic Spray Coatings," published in Surface and Coatings Technology, vol. 111, pages 62–71, Jan. 10, 1999 and the second was entitled "Aluminum coatings via kinetic spray with relatively large powder particles", published in Surface and Coatings Technology 154, pp. 237–252, 2002. The articles discuss producing continuous layer coatings having high adhesion, low oxide content and low thermal stress. The articles describe coatings being produced by entraining metal powders in an accelerated gas stream, through a converging-diverging de Laval type nozzle and projecting them against a target substrate surface. The particles are accelerated in the high velocity gas stream by the drag effect. The gas used can be any of a variety of gases including air, nitrogen, argon, neon or helium. It was found that the particles that formed the coating did not melt or thermally soften prior to impingement onto the substrate. It is theorized that the particles adhere to the substrate when their kinetic energy is converted to a sufficient level of thermal and mechanical deformation upon striking the substrate. Thus, it is believed that the particle velocity must exceed a critical velocity and be high enough to exceed the yield stress of the particle to permit it to adhere when it strikes the substrate. It was found that the deposition efficiency of a given particle mixture was increased as the inlet gas temperature was increased. Increasing the inlet gas temperature decreases its density and thus increases its velocity. The velocity varies approximately as the square root of the inlet gas temperature. The actual mechanism of bonding of the particles to the substrate surface is not fully known at this time. The critical velocity is dependent on the material of the particle and the material of the substrate. Once an initial layer of particles has been formed on a substrate subsequent particles bind not only in the voids between previous particles bound to the substrate but also engage in particle to particle bonds. The bonding process is not due to melting of the particles in the main gas stream because the temperature of the particles is always below their melting temperature.

Kinetic spray technology would greatly reduce the cost of manufacturing if it could be used to coat materials covered by plastic-type material without requiring prior removal of the plastic material. One area of special concern is flexible electrical circuitry. In these systems electrical conductors, typically ribbon wire, are covered in a plastic-type coating to protect them and to electrically isolate them from each other. Other plastic covered substrates of interest include ceramics. In the present specification and claims the term plastic-type material is meant to designate not only true plastics but also polyurethanes, polymers, nylons, rubbers, and elastomers. These coverings are relatively soft compared to the metals and ceramics that typically make up the underlying substrate. As mentioned, one common manufacturing environment that could benefit from the technology is the flexible circuit wiring area. This wiring is the typical plastic covered ribbon type wiring found in computers, automobiles and other electrical systems. Currently, when one desires to manufacture an electrical connection point or solderable pad somewhere along the flexible circuit it is necessary to remove the outer plastic covering in some manner prior to making the connection. Typically, this is done by laser ablation, using a punch wheel, or milling. The exposed wiring is then cleaned and finally, electroplated. These steps are very time consuming, require a large manufacturing footprint, and generate waste problems. It would be advantageous to develop a method for applying a kinetic spray coating onto a surface that is covered in a plastic-type material without requiring prior removal of the plastic-type material. The kinetic sprayed coating can serve as an electrical contact or solder point.

SUMMARY OF THE INVENTION

In one embodiment, the present invention is a method of kinetic spray coating a substrate covered by a plastic-type material comprising the steps of: providing particles of a material to be sprayed having an average nominal diameter of from 60 to 250 microns; providing a supersonic nozzle having a converging region connected to a diverging region through a throat; providing a substrate material covered by a plastic-type material and positioned opposite the nozzle; providing a mask having at least one opening therein, pressing the mask against the plastic-type material; directing a flow of a heated main gas through the nozzle; and entraining the particles in the flow of the heated main gas and accelerating the particles to a velocity sufficient to result in the particles passing through the opening in the mask and removing the plastic-type material and then adhering to the substrate material upon impact.

In another embodiment, the present invention is a method of kinetic spray coating a substrate covered by a plastic-type material comprising the steps of: providing particles of a material to be sprayed having an average nominal diameter of from 250 to 1400 microns; providing a supersonic nozzle having a converging region connected to a diverging region through a throat; providing a substrate material covered by a plastic-type material and positioned opposite the nozzle; directing a flow of a heated main gas through the nozzle; and entraining the particles in the flow of the heated main gas and accelerating the particles to a velocity sufficient to result in the particles passing through the plastic-type material and adhering to the substrate material upon impact.

BRIEF DESCRIPTION OF THE DRAWINGS

The present invention will now be described, by way of example, with reference to the accompanying drawings, in which:

FIG. 2 is an enlarged cross-sectional view of one embodiment of a kinetic spray nozzle used in the system;

FIG. 3 is a schematic diagram of one embodiment of the present invention;

DESCRIPTION OF A PREFERRED EMBODIMENT

Figure 1:
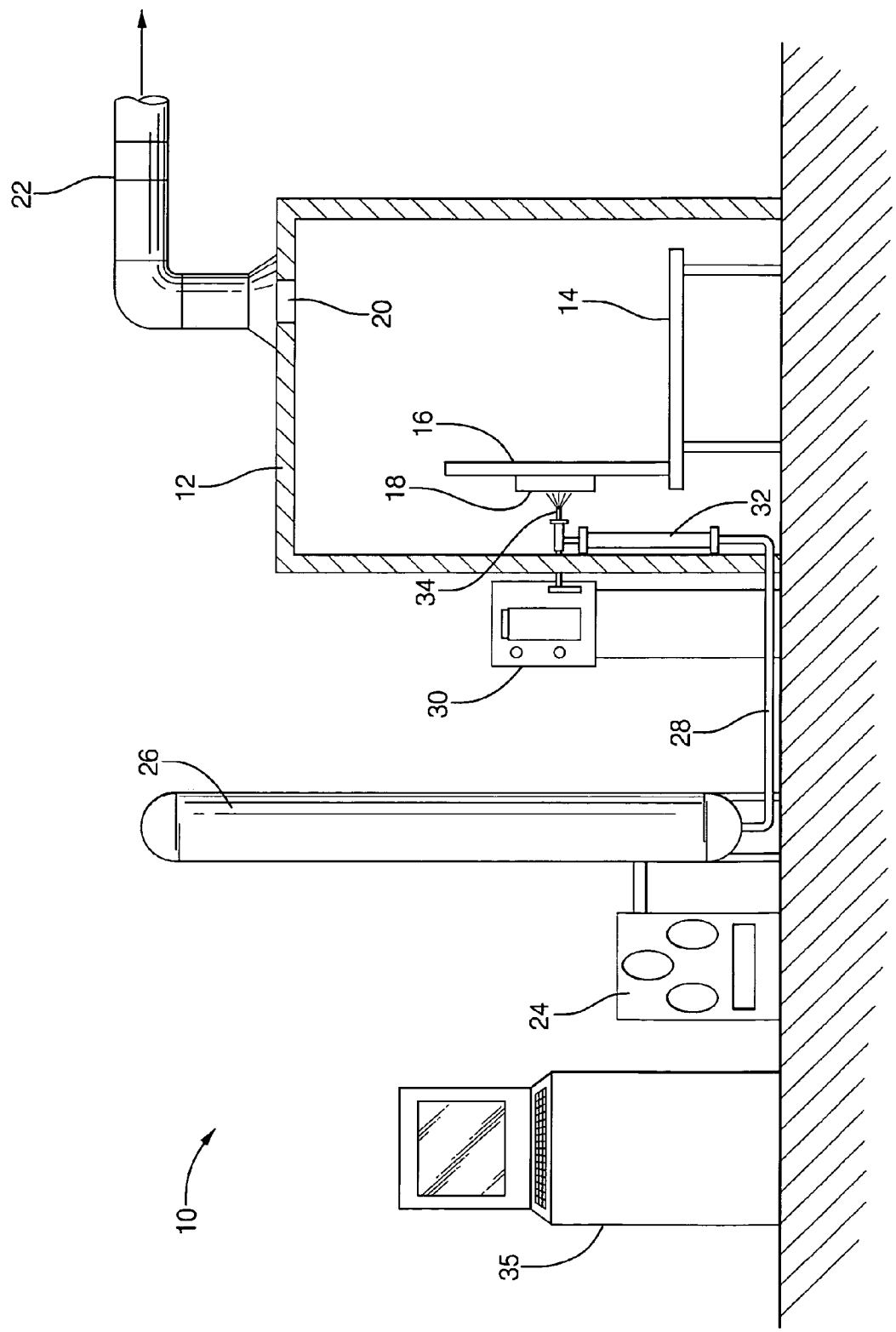
FIG. 1 is a generally schematic layout illustrating a kinetic spray system for performing the method of the present invention.

Referring first to FIG. 1, a kinetic spray system according to the present invention is generally shown at 10. System 10 includes an enclosure 12 in which a support table 14 or other support means is located. A mounting panel 16 fixed to the table 14 supports a work holder 18 capable of movement in three dimensions and able to support a suitable covered substrate to be coated. The work holder 18 is preferably designed to move a substrate relative to a nozzle 34 of the system 10, thereby controlling where the powder material is deposited on the substrate. In other embodiments, workholder 18 can be stationary and designed to feed a substrate past the nozzle 34, as described below. The enclosure 12 includes surrounding walls having at least one air inlet, not shown, and an air outlet 20 connected by a suitable exhaust conduit 22 to a dust collector, not shown. During coating operations, the dust collector continually draws air from the enclosure 12 and collects any dust or particles contained in the exhaust air for subsequent disposal.

The spray system 10 further includes a gas compressor 24 capable of supplying gas pressure up to 3.4 MPa (500 psi) to a high pressure gas ballast tank 26. The gas ballast tank 26 is connected through a line 28 to both a powder feeder 30 and a separate gas heater 32. The gas heater 32 supplies high pressure heated gas, the main gas described below, to a kinetic spray nozzle 34. The pressure of the main gas generally is set at from 150 to 500 psi, more preferably from 300 to 400 psi. The powder feeder 30 mixes particles of a spray powder with unheated gas at a lower pressure and supplies the mixture to a supplemental inlet line 48 of the nozzle 34. As discussed below, the powder feeder 30 is a low pressure feeder. Preferably the particles are fed at a rate of from 0.2 to 10 grams per second to the nozzle 34, more preferably at a rate of from 0.2 to 4 grams per second. A computer control 35 operates to control the pressure of gas supplied to the gas heater 32, the temperature of the heated main gas exiting the gas heater 32, and the pressure of the gas supplied to the powder feeder 30.

The particles used in the present invention are preferably either electrically conductive materials or solderable materials including: tin, tin alloys, especially tin silver alloys, aluminum, aluminum alloys, silver, silver alloys, gold, gold alloys, lead, lead alloys, zinc, zinc alloys, and mixtures of these materials. In one embodiment, the powders preferably have nominal average particle diameters of from 60 to 250 microns and more preferably from 177 to 250 microns. In another embodiment, the particles powders preferably have nominal average particle sizes of from 250 to 1400 microns and more preferably from 600 to 1400 microns. Depending on the particles or combination of particles chosen the main gas temperature may range from 315 to 710 degrees Celsius. With aluminum and its alloys the temperature preferably is around 315° C., while the other materials preferably are sprayed at a main gas temperature of from 400 to 710° C. Mixtures of the materials may be sprayed at from 315 to 710° C. It will be recognized by those of skill in the art that the temperature of the particles in the gas stream will vary depending on the particle size and the main gas temperature. The main gas temperature is defined as the temperature of heated high-pressure gas at the inlet to the nozzle 54. Since the particles are never heated to their melting point, even upon impact, there is no change in the solid phase of the original particles due to transfer of kinetic and thermal energy, and therefore no change in their original physical properties. The particles are always at a temperature below the main gas temperature. The particles exiting the nozzle 34 are directed toward a surface of a substrate to coat it.

FIG. 2 is a cross-sectional view of one embodiment of the nozzle 34 and its connections to the gas heater 32 and the powder feeder 30. This embodiment is a low pressure nozzle 34 that is connected to a low pressure powder feeder 30. A main gas passage 36 connects the gas heater 32 to the nozzle 34. Passage 36 connects with a premix chamber 38 that directs gas through a flow straightener 40 and into a chamber 42. Temperature and pressure of the heated main gas are monitored by a gas inlet temperature thermocouple 44 in the passage 36 and a pressure sensor 46 connected to the chamber 42. The main gas has a temperature that is always insufficient to cause melting in the nozzle 34 of any particles being sprayed. With this nozzle 34 the main gas temperature generally ranges from 315 to 710° C. The main gas temperature can be well above the melt temperature of the particles. Main gas temperatures that are 5 to 7 fold above the melt temperature of the particles have been used in the present system 10. What is necessary is that the temperature and exposure time to the main gas be selected such that the particles do not melt in the nozzle 34. The temperature of the main gas decreases rapidly as it travels through the nozzle 34. In fact, the temperature of the main gas measured as it exits the nozzle 34 is often at or below room temperature even when its initial temperature is above 530° C.

Chamber 42 is in communication with a de Laval type supersonic nozzle 54. The nozzle 54 has a central axis 52 and an entrance cone 56 that decreases in diameter to a throat 58. The entrance cone 56 forms a converging region of the nozzle 54. Downstream of the throat 58 is an exit end 60 and a diverging region is defined between the throat 58 and the exit end 60. The largest diameter of the entrance cone 56 may range from 10 to 6 millimeters, with 7.5 millimeters being preferred. The entrance cone 56 narrows to the throat 58. The throat 58 may have a diameter of from 3.5 to 1.5 millimeters, with from 3 to 2 millimeters being preferred. The diverging region of the nozzle 54 from downstream of the throat 58 to the exit end 60 may have a variety of shapes, but in a preferred embodiment it has a rectangular cross-sectional shape. At the exit end 60 the nozzle 54 preferably has a rectangular shape with a long dimension of from 8 to 14 millimeters by a short dimension of from 2 to 6 millimeters.

In use of this nozzle 54 a mixture of unheated low pressure gas and coating powder is fed from the powder feeder 30 through one of a plurality of supplemental inlet lines 48 each of which is connected to a powder injector tube 50 comprising a tube having a predetermined inner diameter. For simplicity the actual connections between the powder feeder 30 and the inlet lines 48 are not shown. The injector tubes 50 supply the particles to the nozzle 54 in the diverging region downstream from the throat 58, which is a region of reduced pressure. The length of the nozzle 54 from the throat 58 to the exit end can vary widely and typically ranges from 80 to 400 millimeters.

As would be understood by one of ordinary skill in the art the number of injector tubes 50, the angle of their entry relative to the central axis 52 and their position downstream from the throat 58 can vary depending on any of a number of parameters. In FIG. 2 ten injector tubes 50 are show, but the number can be as low as one and as high as the available room of the diverging region. Preferably, the number of injector tubes 50 is from 1 to 3 and more preferably only 1. The angle of their entry relative to the central axis 52 can be any that ensures that the particles are directed toward the exit end 60, basically from 1 to about 90 degrees. It has been found that an angle of 45 degrees relative to central axis 52 works well. An inner diameter of the injector tube 50 can vary between 0.4 to 3.0 millimeters. The use of multiple injector tubes 50 permits one to easily modify the system 10. One can rapidly change particles by turning off a first powder feeder 30 connected to a first injector tube 50 and the turning on a second powder feeder 30 connected to a second injector tube 50. Such a rapid change over is not easily accomplished with a single powder feeder 30 system. For simplicity only one powder feeder 30 is shown in FIG. 1, however, as would be understood by one of ordinary skill in the art, the system 10 could include a plurality of powder feeders 30. The system 10 also permits one to mix a number of powders in a single injection cycle by having a plurality of powder feeders 30 and injector tubes 50 functioning simultaneously. An operator can also run a plurality of particle populations, each having a different average nominal diameter, with the larger population being injected closer to the throat 58 relative to the smaller size particle populations and still get efficient deposition. The system 10 permits an operator to better optimize the deposition efficiency of a particle or mixture of particles. For example, it is known that harder materials have a higher critical velocity, therefore in a mixture of particles the harder particles could be introduced at a point closer to the throat 58 thereby giving a longer acceleration time.

Using the nozzle 54 one can use much lower pressures to inject the powder when the injection takes place after the throat 58. All that is required is that it exceed the main gas pressure at the point of injection. The main gas pressure at 2.5 centimeters past the throat 58 can vary from about 14 to 40 pounds per square inch (psi). Preferably the injection takes place at from 1.2 to 5.0 centimeters, and more preferably from 1.7 to 3.8 centimeters beyond the throat 58. Preferably the pressure of the powder injection is from 20 to 60 psi above the pressure of the main gas at the injection point and more preferably from 30 to 50 psi above the main gas pressure at the point of injection. The nozzle 54 produces an exit velocity of the entrained particles of from 100 meters per second to as high as 1200 meters per second.

In the present invention it is preferred that the nozzle 34 be at an angle of from 0 to 20 degrees relative to a line drawn normal to the plane of the surface being coated, more preferably at an angle of from 0 to 5 degrees relative to the normal line. Preferably the work holder 18 moves the substrate past the nozzle 34 at a traverse speed of from 70 to 260 millimeters per second depending on the size of the particles as discussed below. It is preferred that the exit end 60 of the nozzle 54 have a standoff distance from the surface to be coated of from 2.5 to 15 centimeters, again depending on particle size as discussed below.

As discussed above, in one embodiment the particles used have a nominal average diameter of from 250 to 1400 microns and more preferably from 600 to 1400 microns. In this embodiment the particles are large enough that a single particle sprayed per the invention can bind to an underlying substrate and provide an electrical path from the substrate through the overlying plastic layer. Particles of this size can be directly sprayed through the plastic onto the substrate. A schematic diagram of this is shown in FIG. 3. A cross-section of a flexible circuit is generally shown at 80. Flexible circuit 80 includes an overlayer of a plastic 82 and an underlayer of plastic 84 with a plurality of ribbon conductors 86 embedded between them. Particles having a nominal average diameter of from 250 to 1400 microns are shown at 88. Particles 88 bind to the conductors 86 and form an electrical path through the overlaying plastic 82.

Figure 4:
FIG. 4 is scanning electron photo-micrograph of a cross-section through a flexible circuit sprayed in accordance with one embodiment of the invention.

FIG. 4 is a scanning electron photo-micrograph of a cross-section through a flexible circuit 90 kinetically sprayed in accordance with the present invention. The particles were a 100% tin particle population having an average nominal diameter of 400 to 850 microns. The spray parameters were as follows: a powder pressure of 140 psi., powder feed rate of 2 grams/second, main gas temperature of 705° C., injection was at 2.5 centimeters past a throat of 2.8 millimeters, stand-off distance was 3.7 centimeters, and the nozzle 54 had a diverging region length of 280 millimeters with an exit end 60 of 5 by 12.5 millimeters. Flexible circuit 90 includes a plurality of ribbon conductors 92 covered in the plastic. Single tin particles 94 sprayed according to the present invention form an electrical path from the conductor 92 through the plastic layer. These tin particles 94 can serve as electrical contact points or solder points as the situation requires.

In the embodiment, described above, wherein the particles have an average nominal size of from 250 to 1400 microns one can adjust the traverse rate and stand-off distance to ensure that there is no electrical shorting between conductors 92. Thus, from a technical stand point the invention can be carried out without use of a mask. From an aesthetic stand point, however, it may be desirable to use a mask to avoid having any particles in the area between adjacent conductors 92. The mask material can be any of the well known compositions including: steel, stainless steel, ceramic, and metals. This embodiment permits previously unobtainable results. In a single high speed pass one can selectively coat conductors 92 through a plastic layer to form electrical contact points or solder points. If the kinetic spray is applied near an end of the flexible circuit 90 the end can simply be bent over to form a contact that can be inserted into a connector.

In Table 1 below the preferred spray parameters are listed for a series of particle sizes in the range of from 250 to 1400 microns when using a 100% tin particle powder and a nozzle 54 having a throat 58 diameter of 2.8 millimeters, a diverging region length of 280 millimeters and an exit end 60 having dimensions of 5 millimeters by 12.5 millimeters.

TABLE 1

| Particle size microns | Main gas temperature ° C. | Powder feed rate grams/second | Stand-off distance centimeters | Traverse rate millimeters/ second |
|---|---|---|---|---|
| 250 to 600 | 480 to 600 | 0.3 to 3 | 10 to 15 | 75 to 150 |
| 600 to 1400 | 420 to 710 | 0.3 to 3 | 3.5 to 10 | 150 to 260 |

Using the 100% tin particle powder after the nozzle 54 is modified to have a diverging region length of 85 millimeters and an exit end 60 having dimensions of 2 millimeters by 10 millimeters and the particle size is from 250 to 425 microns it is preferred that the parameters be changed as shown in Table 2, below.

TABLE 2

| Particle size microns | Main gas temperature ° C. | Powder feed rate grams/second | Stand-off distance centimeters | Traverse rate millimeters/ second |
|---|---|---|---|---|
| 250 to 425 | 480 to 600 | 0.3 to 3 | 3.5 to 5 | 90 to 125 |

When using particles having an average nominal diameter of from 60 to 250 microns it was found that the process needed to be changed. These particles are too small for a single particle to create an electrical path from the conductor 92 through the plastic layer. It was found that for particles of this size the spray parameters needed to be changed and that a mask is necessary to eliminate potential electrical shorting between adjacent conductors 92. Using the kinetic spray process it is possible to in a single step to remove the plastic overlay and bind a sufficient density of particles to create a contact or solder point while preventing cross flow between adjacent conductors 92.

Figure 5:
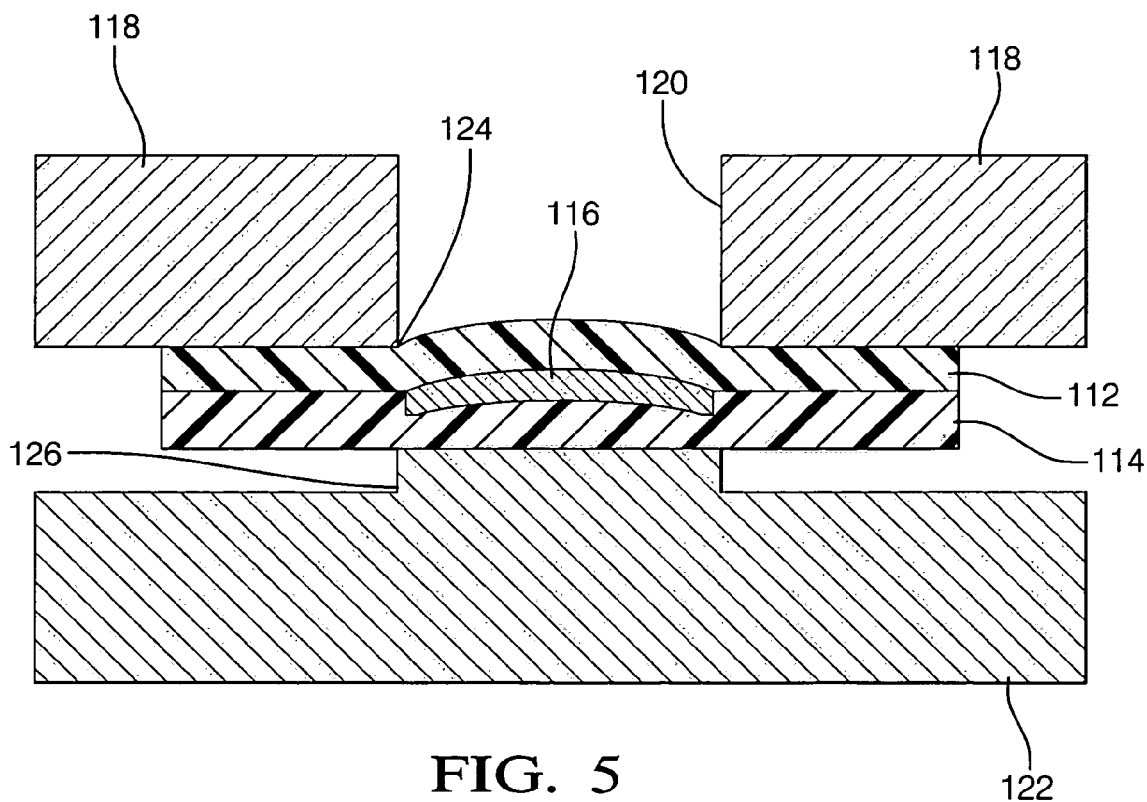
FIG. 5 is a schematic of another embodiment of the present invention.

FIG. 5 is a schematic diagram of the present invention as modified for particles having a size of from 60 to 250 microns. The flexible electrical circuit includes a plastic overlayer 112 and a plastic underlayer 114 with conductors 116 embedded between them. As discussed a mask is necessary and further more a two part mask is required. The mask includes an upper mask 118 having a cutout 120 with a desired shape and a lower mask 122 preferably having a projection 126 having a shape that mirrors that of the cutout 120. The upper and lower masks 118, 122 are held against each other with sufficient pressure to cause some distortion of the plastic layers 112, 114 to ensure a tight seal. Although not shown the masks 118, 122 could be modified so either the upper or the lower includes a ridge matching the cutout with the other mask being flat. Such a design would also permit a tight seal between the two masks and some distortion of the plastic layers 112, 114. Using the two part mask the kinetic spray parameters can be more aggressive and surprisingly it has been found that the initial particles strike with sufficient force to completely remove the plastic overlayer 112 and subsequent particles bind directly to the conductor 116. The mask material can be any of the well known compositions including: steel, stainless steel, ceramic, and a metal.

The preferred parameter setting for particle sizes in the range of from 177 to 250 microns when using a 100% tin particle powder and a nozzle 54 having a throat 58 diameter of 2.8 millimeters, a diverging region length of 280 millimeters and an exit end 60 having dimensions of 5 millimeters by 12.5 millimeters are shown in Table 3 below. In addition, the preferred settings when using the 100% tin particle powder after the nozzle 54 is modified to have a diverging region length of 85 millimeters and an exit end 60 having dimensions of 2 millimeters by 10 millimeters and the particle size is from 60 to 250 microns are shown in Table 3 below.

TABLE 3

| Particle size microns | Main gas temperature ° C. | Powder feed rate grams/second | Stand-off distance centimeters | Traverse rate millimeters/ second |
|---|---|---|---|---|
| 60 to 250 (short nozzle) | 480 to 600 | 0.5 to 2 | 1.2 to 3.0 | 75 to 90 |
| 177 to 250 (long nozzle) | 480 to 600 | 0.5 to 2 | 10 to 15 | 75 to 150 |

Figure 6:
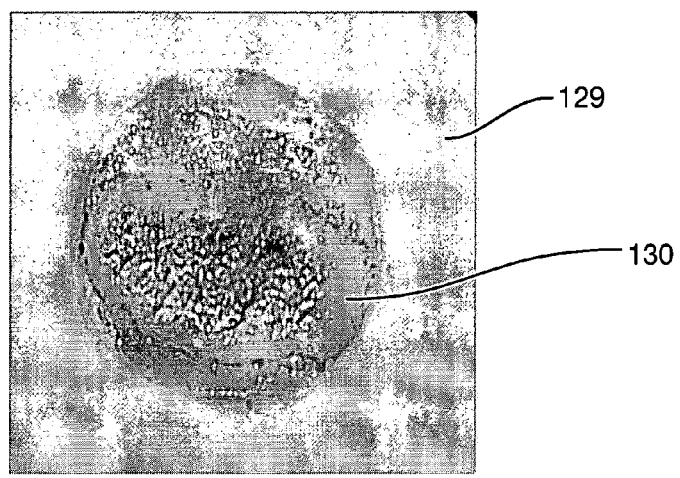
FIG. 6 is a scanning electron photo-micrograph of a flexible circuit kinetically sprayed in accordance with the embodiment illustrated in FIG. 5.
Figure 7:
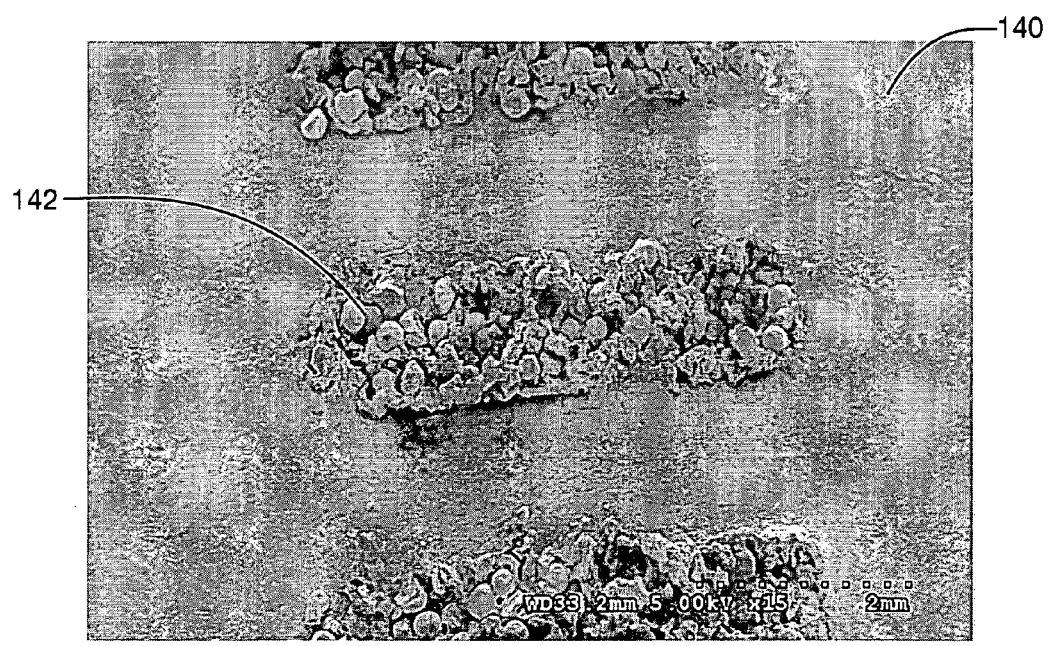
FIG. 7 is another scanning electron photo-micrograph of a flexible circuit kinetically sprayed in accordance with the embodiment illustrated in FIG. 5.

Using these parameters one is able to spray complex patterns with a high degree of precision and very rapidly unlike prior methods. Examples are shown in FIGS. 6 and 7. In FIG. 7 a mask having a circular cutout 120 was used with a nozzle 54 having a rectangular exit end 60. The flexible circuit is shown at 129 and the kinetic sprayed pattern at 130. The pattern 130 has a clean well defined edge and a high density with no overspray on the circuit. The mask was used at a traverse rate of either 75 millimeters per second or 112 millimeters per second and then the contact resistance was tested at a series of points within the pattern 130 at a series of applied mechanical loads. It was found that at all points within the pattern 130 using applied loads of from 20 to 100 grams the contact resistance was from 4 to 1.8 milliOhms. This is within the range that is measured when the tin particles are sprayed directly onto bare copper wire. Thus, the results demonstrate that the spray parameters enable the system 10 to remove the plastic overlayer 112 and bind the particles directly to the conductor 116 at a high rate of speed. In FIG. 7 the cutout 120 was a series of slots to match the spacing of conductors in a flexible circuit 140. The spray pattern 142 has a high density of particles and clean well defined edges with no overspray.

The foregoing invention has been described in accordance with the relevant legal standards, thus the description is exemplary rather than limiting in nature. Variations and modifications to the disclosed embodiment may become apparent to those skilled in the art and do come within the scope of the invention. Accordingly, the scope of legal protection afforded this invention can only be determined by studying the following claims.

We claim:

1. A method of kinetic spray coating a substrate (86, 92) covered by a plastic-type material (82, 84, 90) comprising the steps of:
   a) providing particles of a material to be sprayed having an average nominal diameter of from 600 to 1400 microns;
   b) providing a supersonic nozzle (54) having a converging region (56) connected to a diverging region through a throat (58);
   c) providing a substrate material (86, 92) covered by a plastic-type material (82, 84, 90) and positioned opposite the nozzle (54);
   d) directing a flow of a heated main gas through the nozzle (54); and e) kinetic spraying the particles by entraining the particles in the flow of the heated main gas and accelerating the particles to a velocity sufficient to result in the particles passing through the plastic-type material (82, 84, 90) and adhering to the substrate material (86, 92) upon impact.

2. The method as recited in claim 1, wherein the particles comprise either tin, tin alloys, aluminum, aluminum alloys, silver, silver alloys, gold, gold alloys, lead, lead alloys, zinc, zinc alloys, or a mixture thereof.

3. The method as recited in claim 1, wherein the substrate material (86, 92) comprises at least one electrical conductor material.

4. The method as recited in claim 1, wherein the substrate material (86, 92) comprises a flexible electrical circuit.

5. The method as recited in claim 1, wherein step c) comprises positioning the substrate material (86, 92) at a distance of from 3.5 to 15 centimeters from an exit end (60) of the nozzle (54).

6. The method as recited in claim 1, wherein step e) comprises entraining the particles in the flow of the gas at a point in the diverging region.

7. The method as recited in claim 1, wherein step e) comprises accelerating the particles to a velocity of from 100 to 1200 meters per second.

8. The method as recited in claim 1, wherein step d) comprises providing a heated main gas having a temperature of from about 315 to 710 degrees Celsius.

9. The method as recited in claim 1, further comprising providing a mask (118, 122) having at least one opening (120) therein and positioned between the nozzle (54) and the substrate material (86, 92) and directing the particles through the opening (120).

10. The method as recited in claim 9, wherein the mask (118, 122) is formed from steel, stainless steel, ceramic, a metal, or a mixture thereof.

11. The method as recited in claim 1, wherein the substrate material (86, 92) and the nozzle (54) are moved relative to each other at a traverse speed of from 70 to 260 millimeters per second.

12. The method as recited in claim 11, wherein step e) comprises kinetic spraying the particles in a single pass.

13. The method as recited in claim 1, wherein step e) comprises kinetic spraying the particles in a single pass.

* * * * *